United States Patent
Eddy et al.

(10) Patent No.: US 11,179,832 B2
(45) Date of Patent: Nov. 23, 2021

(54) PRECISION SCREW STARTING DEVICE

(71) Applicant: International Business Machines Corporation, Armonk, NY (US)

(72) Inventors: Kael Benjamin Eddy, Lanesboro, MN (US); Jerael Kayne Eddy, Lanesboro, MN (US); Ryan Paske, Oronoco, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 248 days.

(21) Appl. No.: 16/517,072

(22) Filed: Jul. 19, 2019

(65) Prior Publication Data
US 2021/0016423 A1 Jan. 21, 2021

(51) Int. Cl.
*B25B 23/10* (2006.01)
*B25B 11/02* (2006.01)
*B25B 23/00* (2006.01)
*H05K 5/00* (2006.01)

(52) U.S. Cl.
CPC .............. *B25B 23/10* (2013.01); *B25B 11/02* (2013.01); *B25B 23/005* (2013.01); *H05K 5/0008* (2013.01)

(58) Field of Classification Search
CPC ....... B23B 47/287; B25B 23/02; B25B 23/08; B25B 23/10; B25B 23/101; B25B 23/103; B25B 23/005; B25B 31/00; B25B 9/04; B25C 3/00; B25C 3/002; B25C 3/006
See application file for complete search history.

(56) References Cited

U.S. PATENT DOCUMENTS

| | | |
|---|---|---|
| 2,722,148 A | 11/1955 | Woyton |
| 4,139,036 A | 2/1979 | Regan et al. |
| D273,657 S | 5/1984 | Hanks |
| 4,719,828 A | 1/1988 | Corsetti |
| 5,111,575 A | 5/1992 | Grunze et al. |
| 5,129,292 A | 7/1992 | Albert |
| 5,370,022 A | 12/1994 | Rodriguez et al. |
| 5,957,007 A | 9/1999 | Righini |
| 6,807,884 B2 | 10/2004 | Sillman et al. |
| 6,813,977 B2 * | 11/2004 | Goodhue ................ B25B 23/04 227/137 |

(Continued)

FOREIGN PATENT DOCUMENTS

WO 2011057808 A1 5/2011

OTHER PUBLICATIONS

Schaeffler Technologies. "Metal/Polymer Composite Plain Bearings". Published Oct. 2017. https://www.schaeffler.com/remotemedien/media/_shared_media/08_media_library/01_publications/schaeffler_2/tpi/downloads_8/tpi_211_de_en.pdf.*

*Primary Examiner* — Tyrone V Hall, Jr.
(74) *Attorney, Agent, or Firm* — Cantor Colburn LLP; Tihon Poltavets

(57) ABSTRACT

A screw starting device is provided. The screw starting device includes a body, an adjustment assembly and a screw holder. The body includes a screw holding portion and an indexing surface. The adjustment assembly is integral with the screw holding portion. The screw holder is removably attachable to the adjustment assembly. The screw holder includes an insert selected from a group of inserts respectively compatible with screws of varying types. The adjustment assembly is operable to adjust a location of the screw holder relative to the indexing surface.

20 Claims, 5 Drawing Sheets

(56) References Cited

U.S. PATENT DOCUMENTS

| | | | |
|---|---|---|---|
| 7,146,699 B2 | 12/2006 | Chen | |
| 7,210,208 B2 | 5/2007 | Tseng et al. | |
| 7,743,687 B2 | 6/2010 | Lu et al. | |
| 9,333,642 B2 * | 5/2016 | Courtney | B25H 7/04 |
| 2005/0278934 A1 | 12/2005 | Orchard | |
| 2007/0098508 A1 * | 5/2007 | Dods | B23B 47/287 |
| | | | 408/115 R |
| 2015/0239112 A1 * | 8/2015 | Sook | B25C 3/008 |
| | | | 29/432 |
| 2018/0161966 A1 | 6/2018 | Rensburg | |

* cited by examiner

PRECISION SCREW STARTING DEVICE

BACKGROUND

The present invention generally relates to tools, and more specifically, to a precision screw starting device.

Computing resources are often stored in racks. Racks are typically tall, closet-shaped bodies with multiple drawers arranged along the vertical axis. Each drawer can have one or more computing device supportively disposed therein. The racks can include a base, a top and sidewalls supporting the top above the base. Access to the one or more computing device in each drawer can be provided through a front of the rack, which can either be open or provided with an access door. With the front of the rack open or with the door opened, the one or more computing device in each drawer can often be pulled out of the rack so that it can be manipulated by an operator. Each drawer can include a rail that facilitates this action, where the rail can extend outwardly with components of the drawer and the one or more computing device.

SUMMARY

Embodiments of the present invention are directed to a screw starting device. A non-limiting example of the screw starting device includes a body, an adjustment assembly and a screw holder. The body includes a screw holding portion and an indexing surface. The adjustment assembly is integral with the screw holding portion. The screw holder is removably attachable to the adjustment assembly. The screw holder includes an insert selected from a group of inserts respectively compatible with screws of varying types. The adjustment assembly is operable to adjust a location of the screw holder relative to the indexing surface.

Embodiments of the present invention are directed to a screw starting device for locating a screw to be screwed into a portion of a rail from space between the rail and an interior surface of a rack. A non-limiting example of the screw starting device includes a body, an adjustment assembly and a screw holder. The body includes a screw holding portion and an indexing surface configured to be indexed to the rail whereby the screw holding portion is proximate to the portion of the rail. The adjustment assembly is integral with the screw holding portion. The screw holder is removably attachable to the adjustment assembly. The screw holder includes an insert compatible with the screw. The adjustment assembly is operable to adjust a location of the screw holder relative to the indexing surface such that the insert is aligned with the portion of the rail.

Embodiments of the present invention are directed to a method of operating a screw starting device including a body that includes a screw holding portion and an indexing surface and an adjustment assembly integral with the screw holding portion. A non-limiting example of the method includes inserting inserts compatible with desired screws into a desired number of screw holders, removably attaching the desired number of screw holders to the adjustment assembly and adjusting a location of each of the screw holders relative to the indexing surface such that, when the indexing surface is indexed to a part, the inserts align with screw holes defined in the part.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
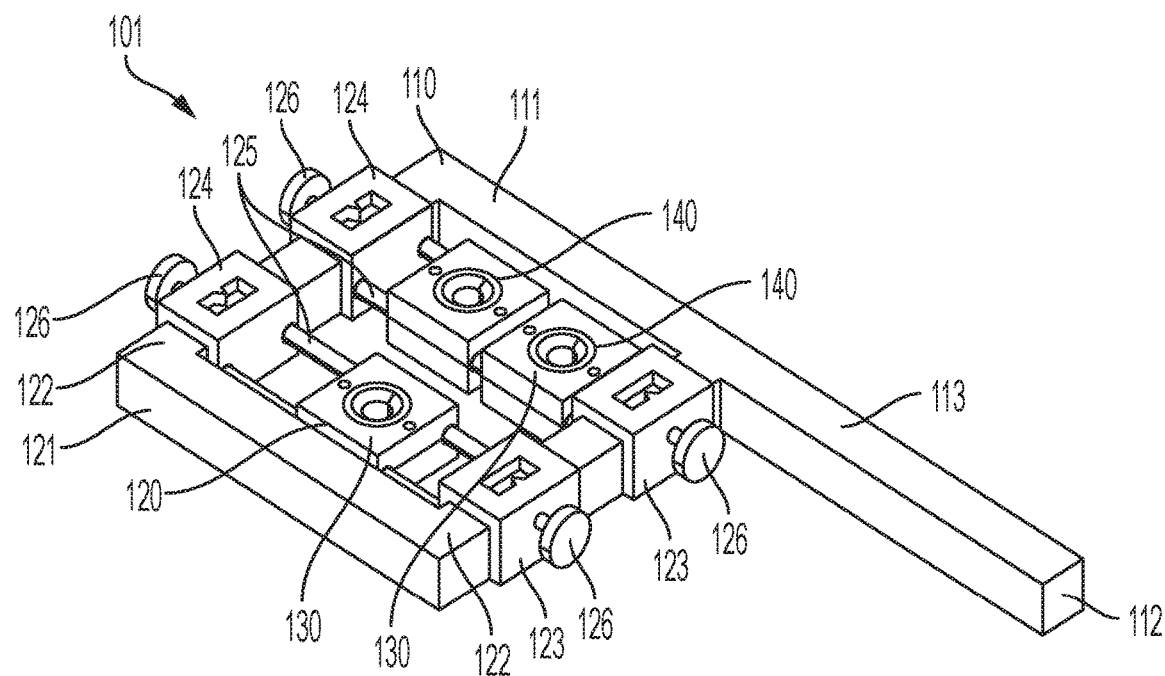
FIG. 1 is a perspective view of a screw starting device in accordance with embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

As will be described below, a screw starting device is provided and includes a body, an adjustment assembly and a screw holder. The body includes a screw holding portion and an indexing surface. The adjustment assembly is integral with the screw holding portion. The screw holder is removably attachable to the adjustment assembly. The screw holder includes an insert selected from a group of inserts respectively compatible with screws of varying types. The adjustment assembly is operable to adjust a location of the screw holder relative to the indexing surface.

It is often necessary to assemble racks and to install computing devices in those racks during an installation. In these or other cases, the area between the interior sides of the racks and the exterior sides of the computing devices, the drawers or the rails can be very small. As such, in certain situations it can be very hard to start turning screws that are needed for various assembly processes. In an exemplary case, a rack assembly might require that screws that are very small (i.e., ~3 mm) be started with almost no clearance between a rail, where the screw is to be installed, and a ridge of the rack. This situation results in the creation of a blind hole with almost zero access and the screw cannot be physically held in place to start the threads by hand or with a tool such as a ratchet.

One or more embodiments of the invention address some the above-described shortcomings of the prior art by providing a jig or a fixture that holds screws in place and allows an operator to locate the screw holes blindly without having visibility to the screw holes and to start the screws with his/her fingers, a ratchet or another tool with no cross threading or dropped screws.

The above-described aspects of the invention address the shortcomings of the prior art by providing a jig or fixture, X-axis and Y-axis adjustability and a removable screw holder. The jig or fixture includes locating elements to locate the screw holes on a part where the screws are being installed. The locating elements could be fixed or adjustable and can locate off a flat surface, a tab or another point of reference on the part into which the screws are being installed. The X-axis and the Y-axis adjustability allows the jig or fixture to be indexed with precision to adjust to different screw locations or configurations. This provides a significant advantage when starting screws of small machines or screws in hard to reach and/or blind areas. The removable screw holder includes an insert, a block that splits in the center to allow it to attach to slide rails for indexing purposes and to allow the insert to be interchanged with a different size. The insert has an embedded o-ring or grommet to hold the screw in place and to provide positive retention and resistance so a ratcheting tool can be used to start and install the screw without dropping it. The insert can be interchanged with other inserts that have different sizes depending upon the size of a screw that is required.

Figure 2:
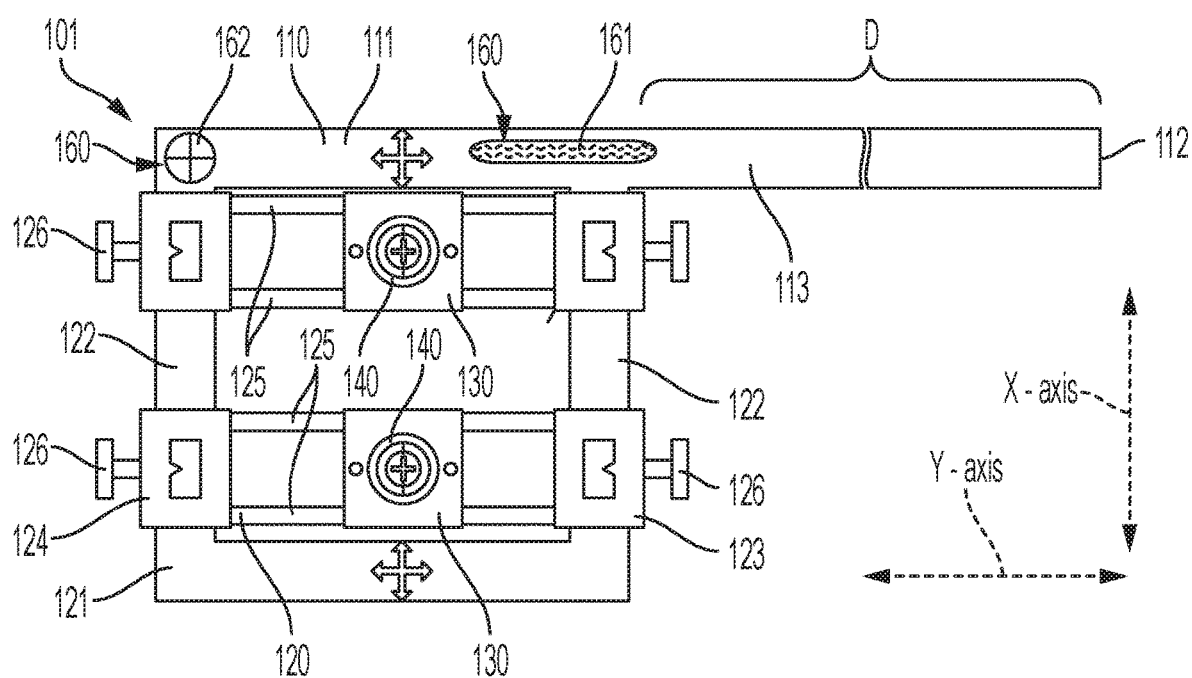
FIG. 2 is a top-down view of the screw starting device of FIG. 1 in accordance with embodiments of the present invention.

Turning now to a more detailed description of aspects of the present invention, FIGS. 1 and 2 depict a screw starting device 101. The screw starting device 101 includes a body 110, an adjustment assembly 120 and a screw holder 130. The body 110 is formed of rigid or semi-material and includes a screw holding portion 111, an indexing surface 112 and a section 113 that extends between the screw holding portion 111 and the indexing surface 112. The section 113 can be an elongate section that separates the indexing surface 112 from the screw holding portion 111 by a distance D (see FIG. 2). The adjustment assembly 120 is integrally formed with the screw holding portion 111. The screw holder 130 is removably attachable to the adjustment assembly 120 and includes an insert 140. The insert 140 is selected from a group of inserts 140, where each insert 140 in the group of inserts 140 is respectively compatible with a screw of one of varying or variable types. The adjustment assembly 120 is operable to adjust a location of the screw holder 130 relative to the indexing surface 112 in both the X-axis and the Y-axis dimensions (see FIG. 2).

In accordance with embodiments and as shown in FIG. 2, the section 113 can have an adjustable length whereby the distance D is similarly adjustable.

The adjustment assembly 120 includes a frame 121 that includes opposite frame sections 122, a first bracket 123 that is slidable along one of the opposite frame sections 122, a second bracket 124 that is slidable along the other one of the opposite frame sections 122, screw holder supporting rails 125 that are each extendable between the first bracket 123 and the second bracket 124 and fasteners 126. The fasteners 126 are configured to secure the first bracket 123 in position along the one of the opposite frame sections 122 and to secure the second bracket 124 in position along the other one of the opposite frame sections 122.

With this construction, it can be seen that the first and second brackets 123 and 124 form a bracket pair. As such, it is to be understood that multiple bracket pairs can be provided for each adjustment assembly 120 as shown in FIGS. 1 and 2.

The screw holder 130 can be provided as multiple screw holders 130 that are each removably attachable to the adjustment assembly 120 and that each include the insert 140. Thus, one or more screw holders 130 can be removably attached to the screw holder supporting rails 125 between one pair of the first and second brackets 123 and 124 and one or more screw holders 130 can be removably attached to the screw holder supporting rails 125 between another pair of the first and second brackets 123 and 124. In each case, each of the inserts 140 for each of the multiple screw holders 130 can be compatible a same type of screw or different types of screws.

Figure 3:
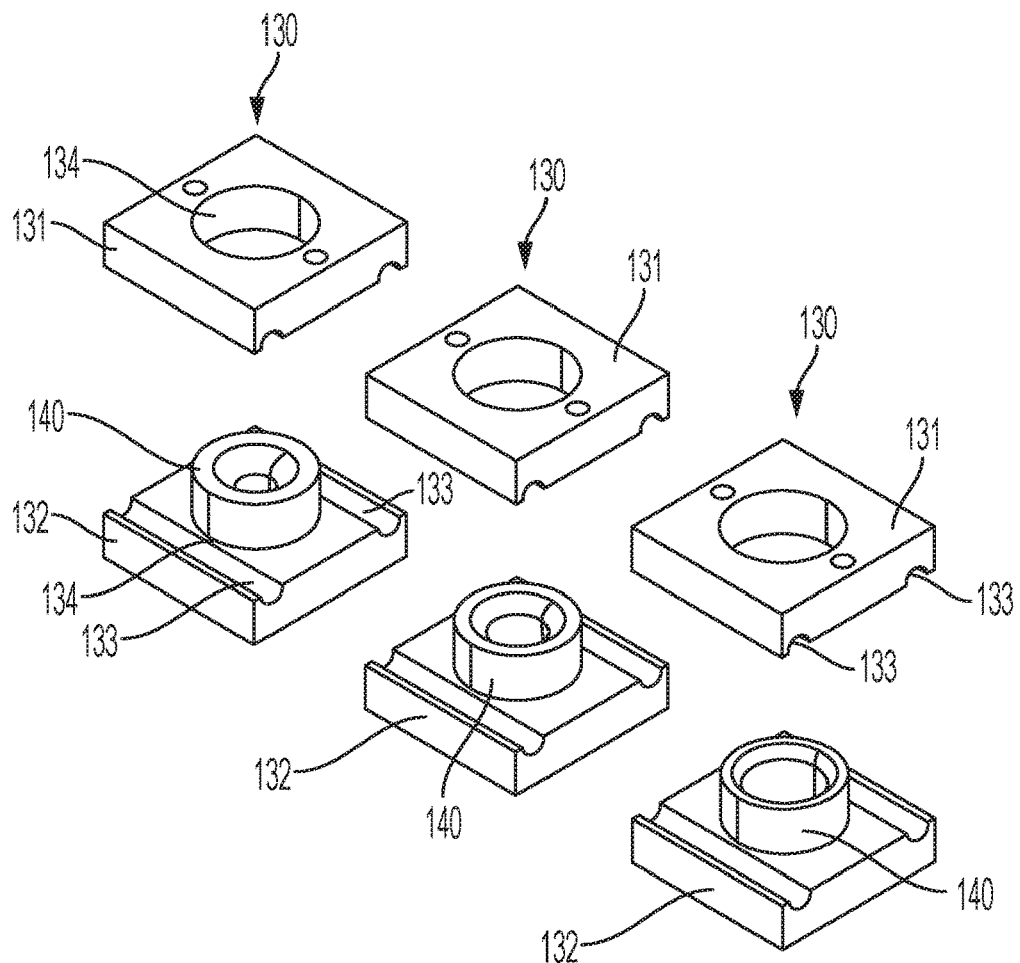
FIG. 3 is an exploded perspective view of screw holders for use in the screw starting device of FIGS. 1 and 2 in accordance with embodiments of the present invention.

With reference to FIG. 3, each screw holder 130 includes a first component 131 and a second component 132. The first component 131 and the second component 132 are tightly attachable to each other and to opposite sides of the screw supporting rails 125 of the adjustment assembly 120. The attachments of the first and second components 131 and 132 to the opposite sides of the screw supporting rails 125 can be accomplished by the formation of rail grooves 133 in complementary surfaces of the first and second components 131 and 132. These rail grooves 133 tightly fit around the screw supporting rails 125 such that the screw holders 130 can be slid along the screw supporting rails 125 by an operator but will generally hold their respective positions along the screw supporting rails 125 when they are not being slid by the operator.

As shown in FIG. 3, the first and second components 131 and 132 each define an aperture 134. The insert 140 is insertible into and tightly fittable in the aperture 134.

The aperture 134 is also open-ended such that any screw installed or inserted into the insert 140 can be engaged by a tool and screwed into a screw hole of a part through the aperture 134.

Figure 4:
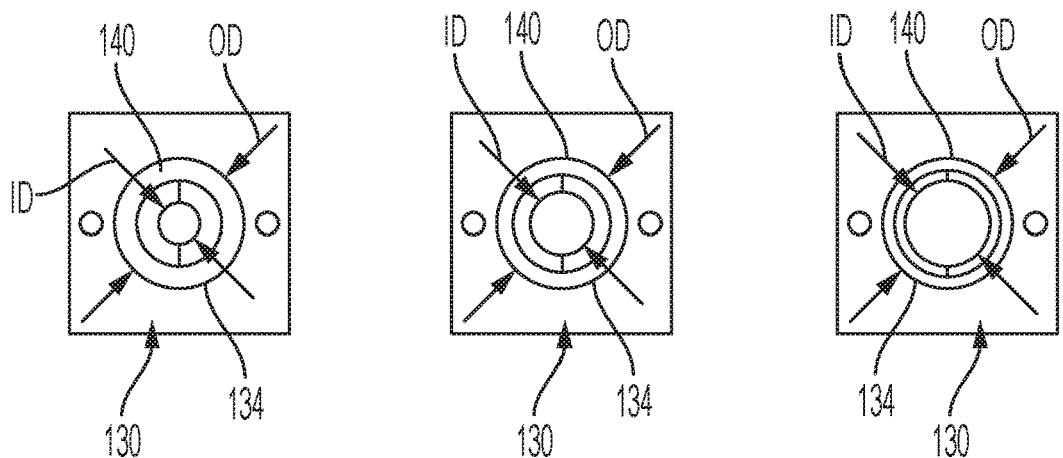
FIG. 4 is a top-down view of screw holders with inserts compatible with varying types of screws in accordance with embodiments of the present invention.

With continued reference to FIG. 3 and with additional reference to FIG. 4, the insert 140 can be formed of one or more of metallic materials and polymeric materials and other similar or suitable materials. Each insert 140 has an outer diameter OD that is tightly fittable into the aperture 134 of the first and second components 131 and 132 of each screw holder 130. Each insert 140 can also have an inner diameter ID of varying dimensions that are compatible with varying types of screws or other fasteners. In accordance with embodiments, the inner diameter ID of each insert 140 can be configured to securely grip onto the head of a screw such that the head can be engaged by a screwdriver or another similar tool and such that the threads on the shaft of the screw are exposed to threads of a screw hole.

Figure 5:
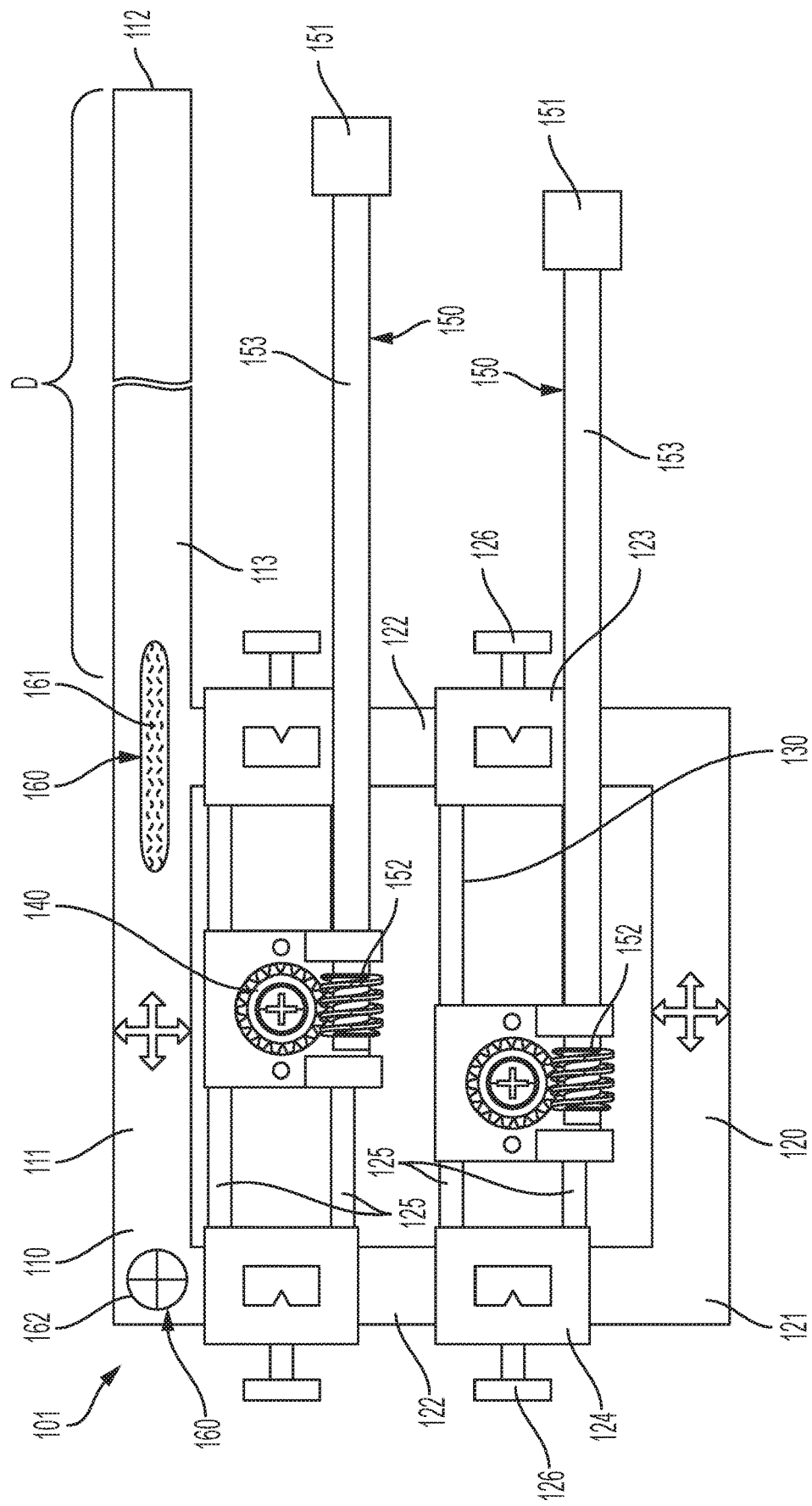
FIG. 5 is a top-down view of a screw starting device in accordance with further embodiments of the present invention.

With reference to FIG. 5 and in accordance with further embodiments of the present invention, the screw starting device 101 can include a screw turning tool 150. As shown in FIG. 5, the screw turning tool 150 includes an operator accessible portion 151, a tool portion 152 that is configured to engage with a screw held in the insert 140 and an elongate portion 153. The tool portion 152 can be provided as a worm gear or another similar or suitable gear configuration. The elongate portion 153 is disposed between the operator accessible portion 151 and the tool portion 152. With this construction, the elongate portion 153 effectively positions the operator accessible portion 151 in a location proximate to the indexing surface 112. Here, the operator accessible portion is likely to be accessible to an operator (or at least more accessible than the screw held in the insert 140) who is responsible for indexing the indexing surface 112 to a part. In addition, with the elongate portion 153 being coupled at opposite ends thereof to the operator accessible portion 151 and the tool portion 152, respectively, a turning of the operator accessible portion 151 causes the tool portion 152 to turn the screw held in the insert 140.

With reference back to FIG. 2 and with continued reference to FIG. 5 and in accordance with further embodiments of the present invention, the screw starting device 101 can include an adjustment assist tool 160 to verify the location of the screw holder(s) 130 relative to the indexing surface 112. The adjustment assist tool 160 can include or be provided as a level 161 that can assist an operator with maintaining a level of the screw starting device 101 as a whole and/or as a sensor system 162. In the latter case, the sensor system 162 can be used to determine whether a location of a screw holder 130 is aligned with a screw hole in a part and, in some cases, to direct (i.e., using illuminated arrows installed in the body 110 as shown in FIGS. 2 and 5) an operator toward further adjustments of the position of the screw holder 130 to an extent the location is determined to be offset.

Figure 6:
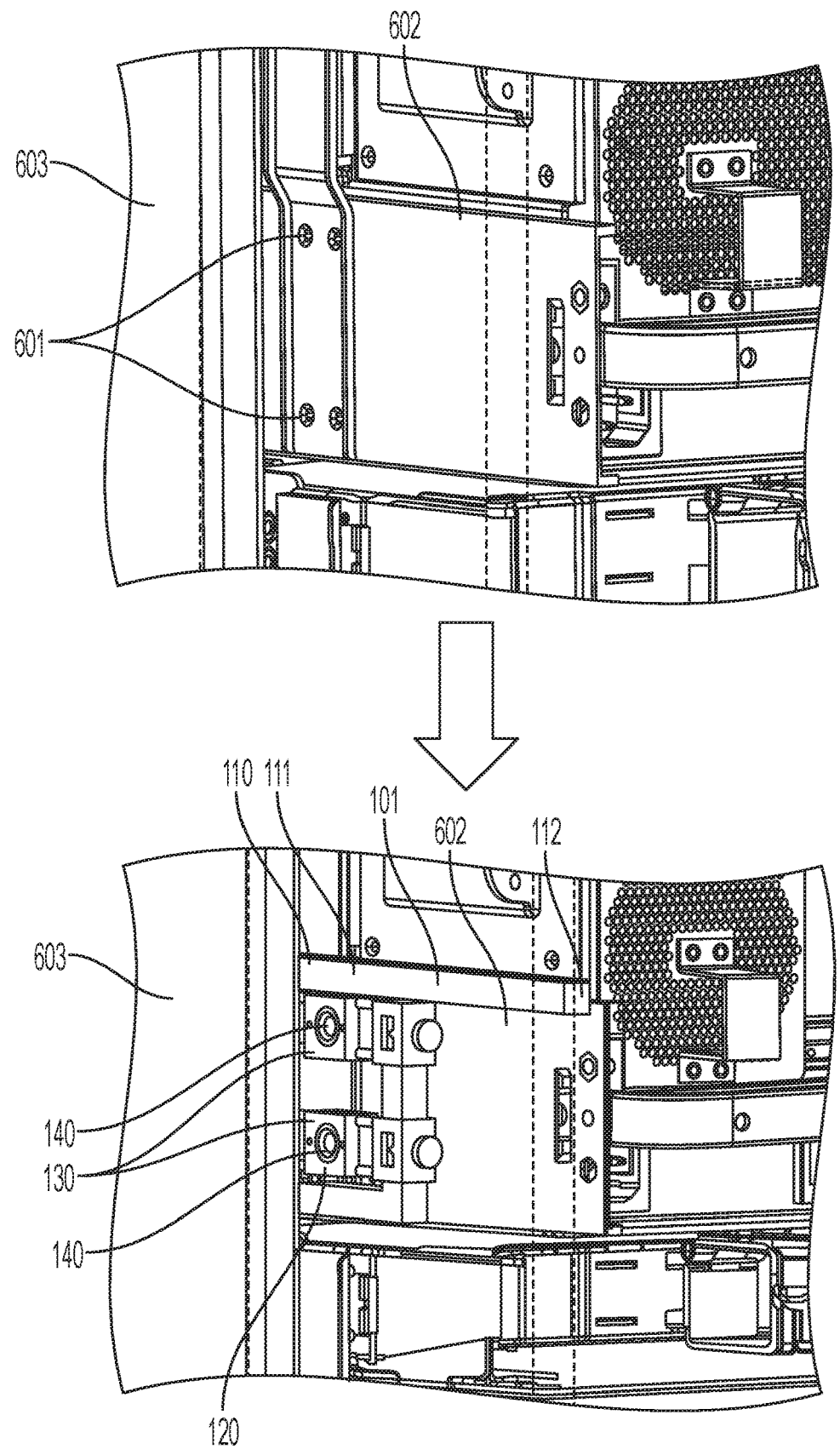
FIG. 6 is an illustration of an operation of the screw starting device of at least FIGS. 1 and 2 in accordance with embodiments of the present invention.

With reference to FIG. 6, the screw starting device 101 (the embodiments of the screw starting device 101 of FIG. 5 are not shown in FIG. 6 but can be incorporated into FIG. 6 by a person of ordinary skill in the art) can be used for locating screws to be screwed into screw holes 601 of a portion of a rail 602 from space defined between the rail 602 and an interior surface of a rack 603. It will be understood that this space is too small for an operator to fit his hand or a conventional ratcheting tool into it without having extreme difficulty in screwing screws into the screw holes 601 or with persistently dropping the screws.

As shown in FIG. 6, the screw starting device 101 includes the body 110 as described above, with the indexing surface 112 being configured to be indexed to the rail 602 whereby the screw holding portion 111 is proximate to the screw holes 601 of the portion of the rail 602, the adjustment assembly 120 integral with the screw holding portion 111 as described above and screw holders 130 as described above. The screw holders 130 are removably attached to the adjustment assembly 120 and include an insert 140 as described above. Each insert 140 is compatible with the screws to be screwed into the screw holes 601 of the portion of the rail 602.

During operations of the screw starting device 101, the adjustment assembly 120 is operable to adjust respective locations of the screw holders 130 relative to the indexing surface 112, which is indexed to the rail 602. Therefore, by operating the adjustment assembly 120, an operator can effectively bring each insert 140 into alignment with a corresponding screw hole 601 of the portion of the rail 602.

Figure 7:
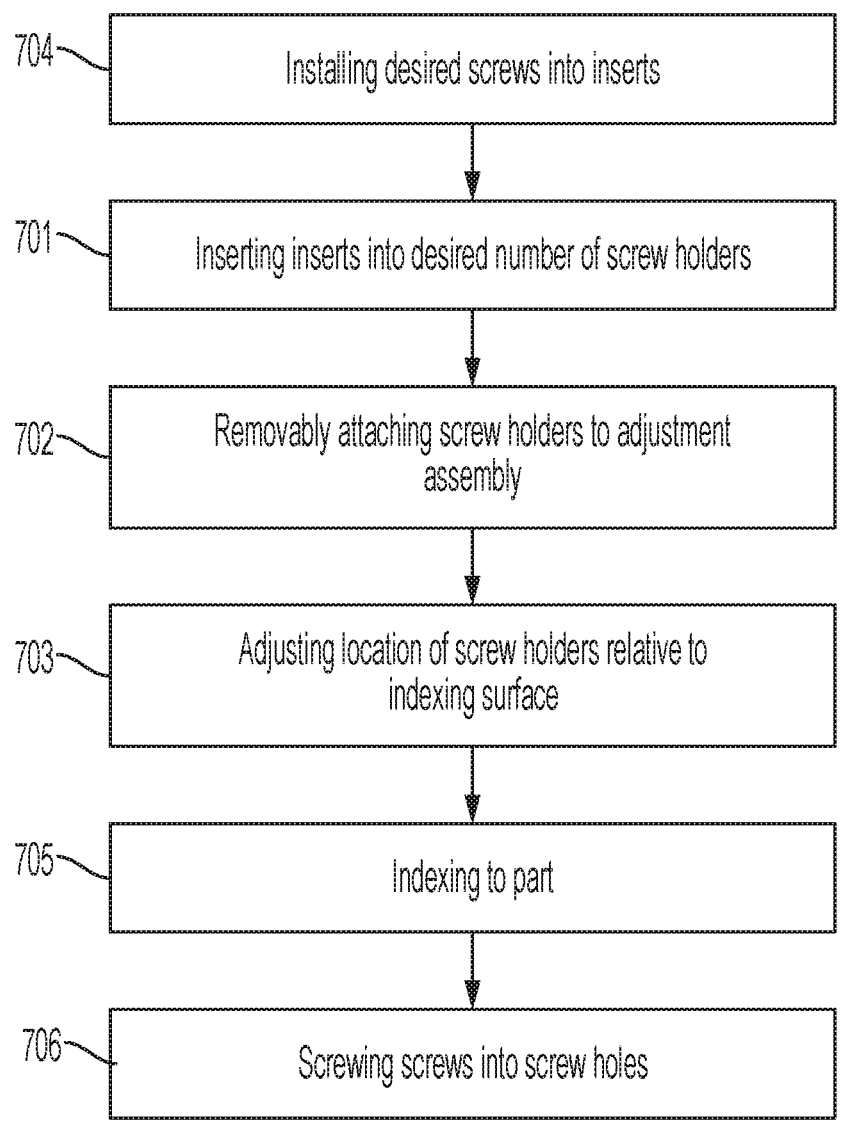
FIG. 7 is a flow diagram illustrating a method of operating a screw starting device including a body that includes a screw holding portion and an indexing surface and an adjustment assembly integral with the screw holding portion in accordance with embodiments of the present invention.

With reference to FIG. 7, a method of operating the screw starting device 101 as described above is provided and includes inserting inserts compatible with desired screws into a desired number of screw holders (block 701) and removably attaching the desired number of screw holders to the adjustment assembly (block 702). In addition, the method includes adjusting a location of each of the screw holders relative to the indexing surface such that, when the indexing surface is indexed to a part, the inserts align with screw holes defined in the part (block 703).

In accordance with further embodiments of the present invention and as shown in FIG. 6, the method can further include installing the desired screws into the inserts (block 704), indexing the indexing surface to the part such that the screws are aligned with the screw holes (block 705) and screwing the screws into the screw holes through the inserts (block 706).

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A screw starting device, comprising:
   a body comprising a screw holding portion, an indexing surface and an elongate section separating the indexing surface from the screw holding portion;
   an adjustment assembly integral with the screw holding portion; and
   a screw holder removably attachable to the adjustment assembly,
   the screw holder comprising an insert selected from a group of inserts respectively compatible with screws of varying types, and
   the adjustment assembly being configured to permit ante adjustment of a location of the screw holder relative to the indexing surface in a first dimension defined along a longitudinal axis of the elongate section and in a second dimension defined transversely relative to the first dimension.

2. The screw starting device according to claim 1, wherein a distance between the screw holding portion and the indexing surface is adjustable.

3. The screw starting device according to claim 1, wherein the adjustment assembly comprises:
   a frame comprising opposite frame sections;
   first and second brackets slidable along the opposite frame sections;
   screw holder supporting rails extendable between the first and second brackets; and
   fasteners configured to secure the first and second brackets in positions along the opposite frame sections.

4. The screw starting device according to claim 1, wherein the screw holder is provided as multiple screw holders each removably attachable to the adjustment assembly and comprising the insert.

5. The screw starting device according to claim 1, wherein:
   the screw holder comprises first and second components tightly attachable to each other and the adjustment assembly, and
   the first and second components each define an aperture into which the insert is tightly fittable.

6. The screw starting device according to claim 1, wherein the insert comprises one or more of metallic material and polymeric material.

7. The screw starting device according to claim 1, further comprising a screw turning tool comprising:
   an operator accessible portion;
   a tool portion configured to engage with a screw held in the insert; and
   an elongate portion disposed between the operator accessible portion and the tool portion whereby the operator accessible portion is proximate to the indexing surface and a turning of the operator accessible portion causes the tool portion to turn the screw held in the insert.

8. The screw starting device according to claim 7, wherein the tool portion comprises a worm gear.

9. The screw starting device according to claim 1, further comprising an adjustment assist tool to verify the location of the screw holder relative to the indexing surface.

10. A screw starting device for locating a screw to be screwed into a portion of a rail from space between the rail and an interior surface of a rack, the screw starting device comprising:
    a body comprising a screw holding portion, and an indexing surface configured to be indexed to the rail whereby the screw holding portion is proximate to the portion of the rail and an elongate section separating the indexing surface from the screw holding portion;
    an adjustment assembly integral with the screw holding portion; and
    a screw holder removably attachable to the adjustment assembly,
    the screw holder comprising an insert compatible with the screw, and
    the adjustment assembly being configured to permit an adjustment of a location of the screw holder relative to the indexing surface in a first dimension defined along a longitudinal axis of the elongate section and in a second dimension defined transversely relative to the first dimension such that the insert is aligned with the portion of the rail.

11. The screw starting device according to claim 10, wherein a distance between the screw holding portion and the indexing surface is adjustable.

12. The screw starting device according to claim 10, wherein the adjustment assembly comprises:
    a frame comprising opposite frame sections;
    first and second brackets slidable along the opposite frame sections, respectively;
    screw holder supporting rails extendable between the first and second brackets; and
    fasteners configured to secure the first and second brackets in positions along the opposite frame sections.

13. The screw starting device according to claim 10, wherein the screw holder is provided as multiple screw holders each removably attachable to the adjustment assembly and comprising the insert.

14. The screw starting device according to claim 10, wherein:
    the screw holder comprises first and second components tightly attachable to each other and the adjustment assembly, and
    the first and second components each define an aperture into which the insert is tightly fittable.

15. The screw starting device according to claim 10, wherein the insert comprises one or more of metallic material and polymeric material.

16. The screw starting device according to claim 10, further comprising a screw turning tool comprising:
    an operator accessible portion;
    a tool portion configured to engage with a screw held in the insert; and
    an elongate portion disposed between the operator accessible portion and the tool portion whereby the operator accessible portion is proximate to the indexing surface and a turning of the operator accessible portion causes the tool portion to turn the screw held in the insert.

17. The screw starting device according to claim 16, wherein the tool portion comprises a worm gear.

18. The screw starting device according to claim 10, further comprising an adjustment assist tool to verify the location of the screw holder relative to the indexing surface.

19. A method of operating a screw starting device comprising a body comprising a screw holding portion, an indexing surface, an adjustment assembly integral with the screw holding portion and an elongate section separating the indexing surface from the screw holding portion, the method comprising:
    inserting inserts compatible with desired screws into a desired number of screw holders;
    removably attaching the desired number of screw holders to the adjustment assembly; and adjusting a location of each of the screw holders relative to the indexing surface in a first dimension defined along a longitudinal axis of the elongate section and in a second dimension defined transversely relative to the first dimension such that, when the indexing surface is indexed to a part, the inserts align with screw holes defined in the part.

20. The method according to claim 19, further comprising:

installing the desired screws into the inserts;
indexing the indexing surface to the part; and
screwing the screws into the screw holes through the inserts.

\* \* \* \* \*